(12) United States Patent
Kasemset et al.

(10) Patent No.: US 10,727,168 B2
(45) Date of Patent: Jul. 28, 2020

(54) INTER-CONNECTION OF A LEAD FRAME WITH A PASSIVE COMPONENT INTERMEDIATE STRUCTURE

(71) Applicant: NXP B.V., Eindhoven (NL)

(72) Inventors: Bodin Kasemset, Bangkok (TH); Peeradech Khunpukdee, Bangkok (TH); Krassavan Tantirittisak, Bangkok (TH)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 14/486,291

(22) Filed: Sep. 15, 2014

(65) Prior Publication Data

US 2016/0079146 A1    Mar. 17, 2016

(51) Int. Cl.
*H01L 23/48*       (2006.01)
*H01L 23/495*      (2006.01)

(52) U.S. Cl.
CPC ...... *H01L 23/49503* (2013.01); *H01L 23/495* (2013.01); *H01L 23/49531* (2013.01); *H01L 23/49551* (2013.01); *H01L 23/49575* (2013.01); *H01L 2224/05554* (2013.01); *H01L 2224/32245* (2013.01); *H01L 2224/45014* (2013.01); *H01L 2224/48* (2013.01); *H01L 2224/48091* (2013.01); *H01L 2224/48247* (2013.01);
(Continued)

(58) Field of Classification Search
CPC ......... H01L 23/49503; H01L 23/49575; H01L 23/495; H01L 23/49551; H01L 23/49531; H01L 2924/15321; H01L 2924/15311; H01L 2224/32245; H01L 2224/48247; H01L 2224/48465; H01L 2224/48091; H01L 2924/00014; H01L 2224/73265; H01L 2224/32225; H01L 2224/48227; H01L 2924/00
See application file for complete search history.

(56) References Cited

U.S. PATENT DOCUMENTS 4,462,534 A * 7/1984 Bitaillou .................. B23K 3/06
                                                228/180.1
5,006,922 A * 4/1991 McShane ................ H01L 23/04
                                                   257/697
(Continued)

FOREIGN PATENT DOCUMENTS

CN      203103286 U     7/2013
CN      203573978 U     4/2014
(Continued)

OTHER PUBLICATIONS

European Search Report for Patent Application No. EP15185135 (dated Mar. 8, 2016).

*Primary Examiner* — Cuong B Nguyen
*Assistant Examiner* — Samuel Park

(57) ABSTRACT

Consistent with an example embodiment, there is a package assembly structure. The structure comprises a lead frame having a topside surface and an opposite under-side surface; the lead frame includes a die attach paddle, wherein a die attach region is defined on the opposite under-side surface. Pad landings surround the die attach region. A plurality of locking pins are arranged at predetermined locations about the die attach paddle, on the top side surface. The plurality of locking pins may be formed integrally in the lead frame and project upward from the top side surface.

20 Claims, 9 Drawing Sheets

(52) U.S. Cl.
CPC .............. *H01L 2224/48465* (2013.01); *H01L 2224/49171* (2013.01); *H01L 2224/73265* (2013.01); *H01L 2224/8385* (2013.01); *H01L 2224/83205* (2013.01); *H01L 2224/83801* (2013.01); *H01L 2224/92247* (2013.01); *H01L 2924/00014* (2013.01); *H01L 2924/15311* (2013.01); *H01L 2924/15321* (2013.01); *H01L 2924/181* (2013.01)

(56) References Cited

U.S. PATENT DOCUMENTS

| | | | | |
|---|---|---|---|---|
| 5,485,039 | A * | 1/1996 | Fujita | H01L 23/473 |
| | | | | 257/697 |
| 6,108,212 | A * | 8/2000 | Lach | H01L 21/4853 |
| | | | | 174/255 |
| 7,411,289 | B1 | 8/2008 | McLellan et al. | |
| 8,269,330 | B1 | 9/2012 | Lee et al. | |
| 2006/0057781 | A1 | 3/2006 | Shiffer | |
| 2009/0278246 | A1* | 11/2009 | Hoshino | H01L 21/6835 |
| | | | | 257/686 |
| 2009/0289336 | A1* | 11/2009 | Meghro | H01L 23/49517 |
| | | | | 257/676 |
| 2011/0058915 | A1 | 3/2011 | Scroggie et al. | |
| 2012/0127681 | A1* | 5/2012 | Ryu | H05K 3/3447 |
| | | | | 361/772 |
| 2013/0163215 | A1 | 6/2013 | Sun | |

FOREIGN PATENT DOCUMENTS

| | | |
|---|---|---|
| GB | 2 178 789 | 2/1987 |
| JP | 2013058530 A | 3/2013 |

\* cited by examiner

INTER-CONNECTION OF A LEAD FRAME WITH A PASSIVE COMPONENT INTERMEDIATE STRUCTURE

FIELD

The disclosure is directed toward a lead frame having a passive component intermediate structure. More particularly, the lead frame is modified to provide enhanced mechanical anchoring of the intermediate structure having passive components placed thereon.

BACKGROUND

Electronic components and systems destined for use in automotive applications must perform under severe environmental conditions. Within the engine compartment, operating temperatures may range from −40° C. to above 125° C. Exposure to elements on the road, such as dirt, grease, salt, etc., takes its toll on mechanical and electronic components. A number of these components are combinations of discrete passive components such as capacitors, inductors, and resistors connected to integrated circuit devices.

As more and more mechanical components in the automobile are replaced by electronics, there are the competing requirements of designing and building the components and electronic subsystems (i.e, engine control systems, anti-lock braking systems, air bag control systems, security systems, etc.) to be both durable yet cost-effective. The electronics must be reliable even after years of exposure to the severe operating environment. Failure of these components may be catastrophic.

There is a need for a packaging technique of combining passive components with integrated circuits which is sufficiently robust to withstand the rigors of an automotive environment.

SUMMARY

The present disclosure has been found useful in assembling components that can withstand the rigors of an automotive environment. An integrated circuit is mounted onto a first surface of a lead frame and electrically connected to it. Additional passive components are mounted onto an intermediate substrate. The intermediate substrate is mounted on a surface opposite the first surface. The passive components mounted on the intermediate substrate in some applications, may be connected to selected bond pads on the integrated circuit through mechanical locking connectors on the intermediate substrate and those included on the opposite side surface of the lead frame. These locking connectors in the lead frame or intermediate substrate may either be locking pins or receptacles receiving the locking pins. These locking connectors provide mechanical strength in holding together the intermediate substrate populated with passive components with the lead frame and attached integrated circuit. The assembly of the lead frame, intermediate substrate, and integrated circuit are often encapsulated in a molding compound in an a system in package configuration. In one particular case, the packaged device is part of an automotive immobilizer system.

In an example embodiment, there is a package assembly structure comprising a lead frame having a top-side surface and an opposite under-side surface. The lead frame includes a die attach paddle, wherein a die attach region is defined on the opposite under-side surface; pad landings surround the die attach region. A plurality of locking pins is arranged at predetermined locations about the die attach paddle on the top-side surface. A feature of this embodiment is that the plurality of locking pins may be formed integrally in the lead frame.

In another example embodiment, an electronic device comprises a lead frame having a top-side surface and an opposite under-side surface, the lead frame including, a die attach paddle, wherein a die attach region are defined on the opposite under-side surface, pad landings surrounding the die attach region; and a plurality of locking couplings of a gender arranged at predetermined locations about the die attach paddle, on the topside surface. An intermediate substrate has locking couplings of an opposite gender corresponding to the predetermined locations for frictionally receiving the locking couplings of the lead frame and provide mechanical connection between the lead frame and the intermediate substrate; the intermediate substrate is mounted on the topside surface of the lead frame. The intermediate substrate has areas defined for passive component circuit. An active device die is attached to the die attach region on the opposite under-side surface of the lead frame and bond pads of the active device die are electrically connected to the pad landings by conductive interconnects.

The above summaries of the present disclosure are not intended to represent each disclosed embodiment, or every aspect, of the present invention. Other aspects and example embodiments are provided in the figures and the detailed description that follow.

BRIEF DESCRIPTION OF THE DRAWINGS

The invention may be more completely understood in consideration of the following detailed description of various embodiments disclosed in connection with the accompanying drawings, in which.

Figure 1A:
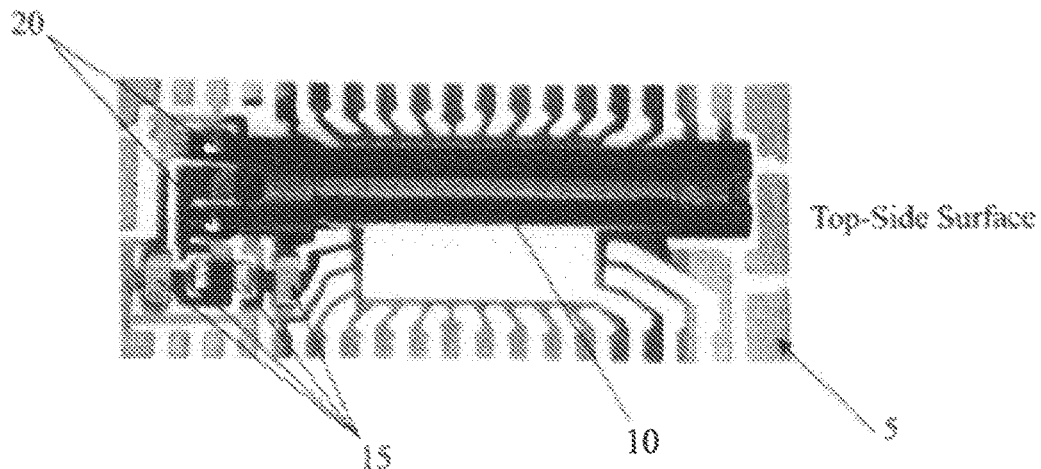
FIGS. 1A-1C (Prior Art) illustrate an example of assembly of passive component assembly and integrated circuit device on a single lead frame in an electronic immobilizer package.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention as defined by the appended claims.

DETAILED DESCRIPTION

The disclosed embodiments have been found useful in increasing the reliability of assembling components that include integrated circuit (IC) devices connected to structures having passive components, such as resistors, capacitors, and inductors. In an example embodiment, on a front-side surface a lead frame substrate, an IC attached to a lead frame substrate located on a front-side surface, active device pads are wire bonded to defined areas on the lead frame. Additional passive components are mounted (usually via a pick-and-place process) onto a separate intermediate substrate. The intermediate substrate is attached, via locking connectors, to an opposite back side surface of the lead frame. The locking connectors include holes or locking pins in the lead frame or intermediate substrate and are of opposite gender. Predefined conductive traces in the lead frame electrically connect particular IC device pins to selected passive components via the IC device wire-bonds and predefined traces connected to the locking connectors. The assembly is encapsulated in molding compound. In an example embodiment, a particular package used is an electronic immobilizer package, which resembles a plastic dual-in-line (PDIP) package. In these embodiments, additional components beyond the integrated circuit are combined together to build circuit subsystems that fit into a single package.

Figure 1B:
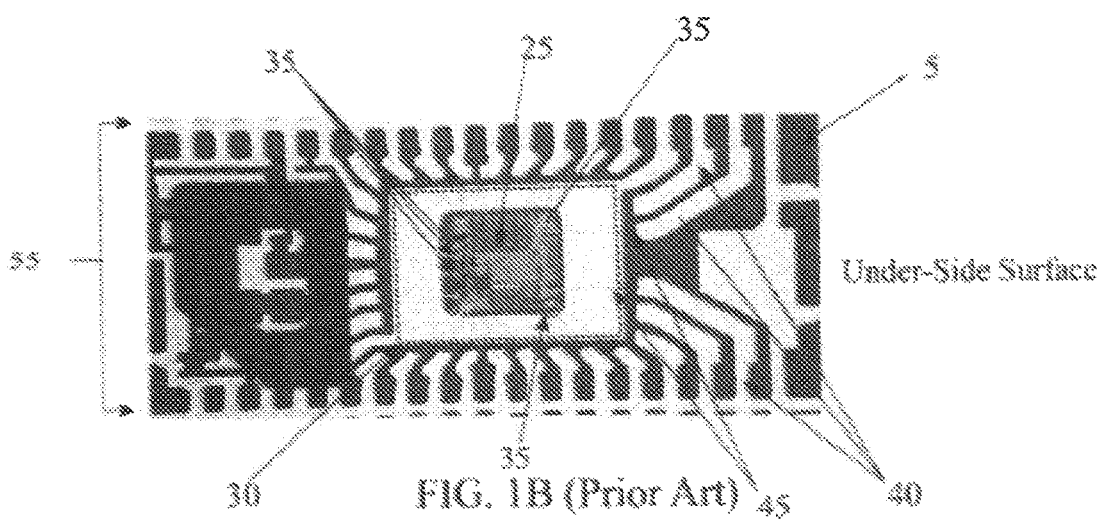
Figure 1C:
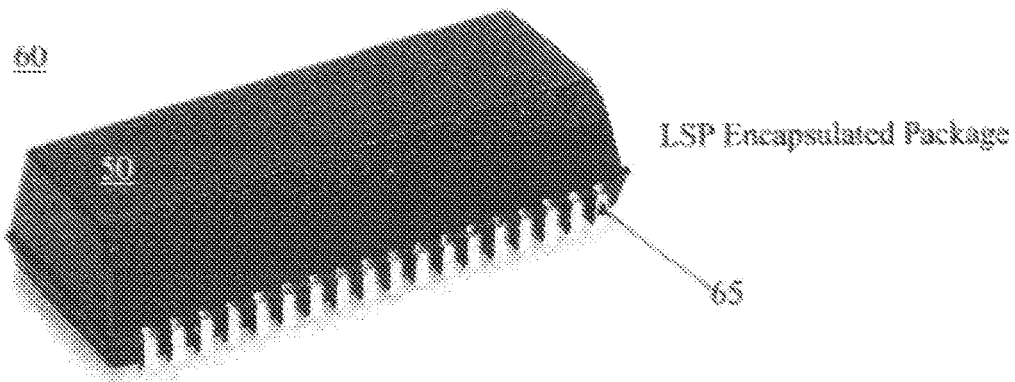

Refer to FIGS. 1A-1C. On a top side surface of a lead frame assembly 5, there are pads defined for the placement of passive components, such as chip capacitors 15, and contacts 20 for a coil 10. The passive components are glued and soldered onto the lead frame assembly 5. On the opposite under-side surface of the lead frame assembly 5, a device die 25 is bonded to a die attach area 30 (as indicated by the dashed-lined box), wire bonds 45 electrically connect die bond pads 35 to lead frame pad landings ("fingers") 40. The circuit assembly 55 is encapsulated in a suitable molding compound 50, resulting in the LSP package 60.

The present LSP package assembly may suffer delamination between glue attaching components to the lead frame and the lead frame causing functional failures. Further, during the manufacturing process, short circuits may occur between passive components owing to conductive glue flowing between component connections. From production handling, the glued components may be dislodged from the lead frame.

In accordance with the present disclosure, passive components are integrated onto an intermediate substrate, such as a printed circuit board (PCB), so as to become a passive component unit. In one example embodiment, the lead frame has a plurality of locking clips defined thereon. These locking clips engage locations defined in the passive component unit; the locking clips provide enhanced mechanical engagement of the passive component unit with the lead frame. In an example embodiment, the locking clips frictionally engage holes defined in the passive component unit; optionally after their frictional engagement, the locking pin may be soldered to provide electrical connection. The lead frame has a die attach area to which an IC device is bonded. The die attach area is surrounded by pad landings to which device die bond pads are wire bonded. Per design requirements, the appropriate pins on the IC device are connected to the passive components. The assembly of the lead frame, the intermediate passive component unit, and device die are encapsulated into a molding compound.

Figure 2A:
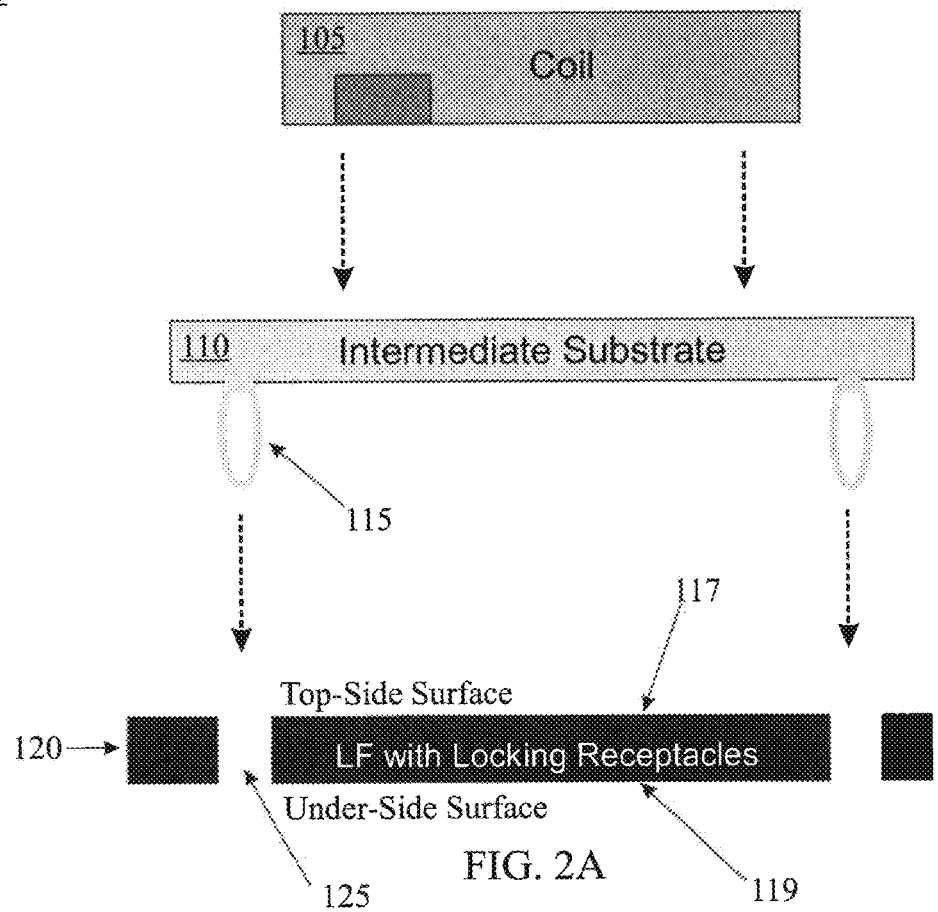
FIGS. 2A-2D present side views of assembly an example embodiment of the present disclosure.
Figure 2B:
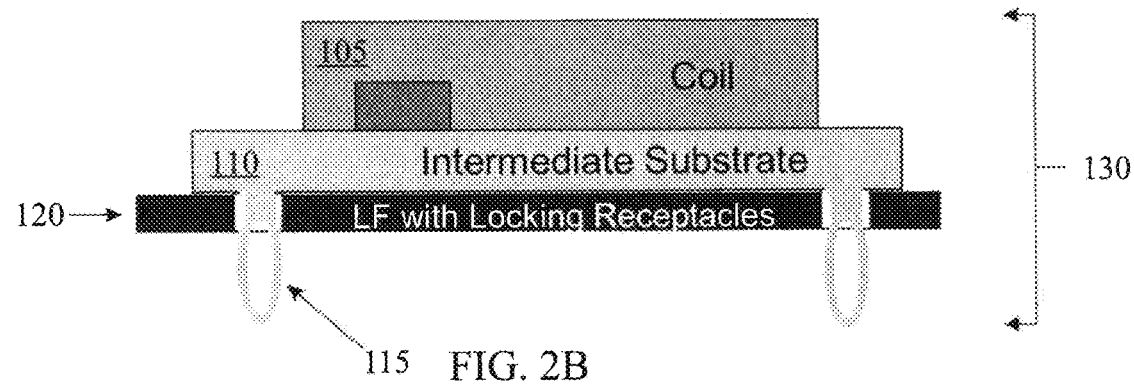
Figure 2C:
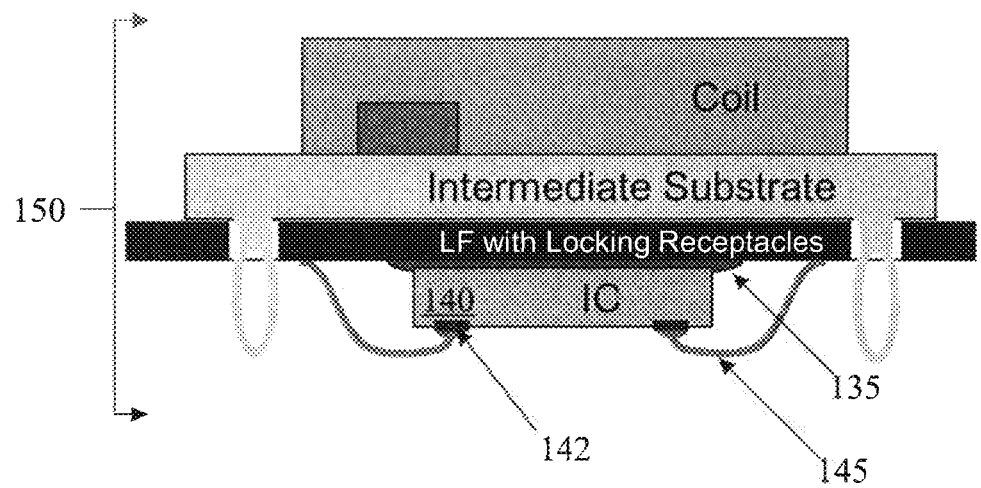
Figure 2D:
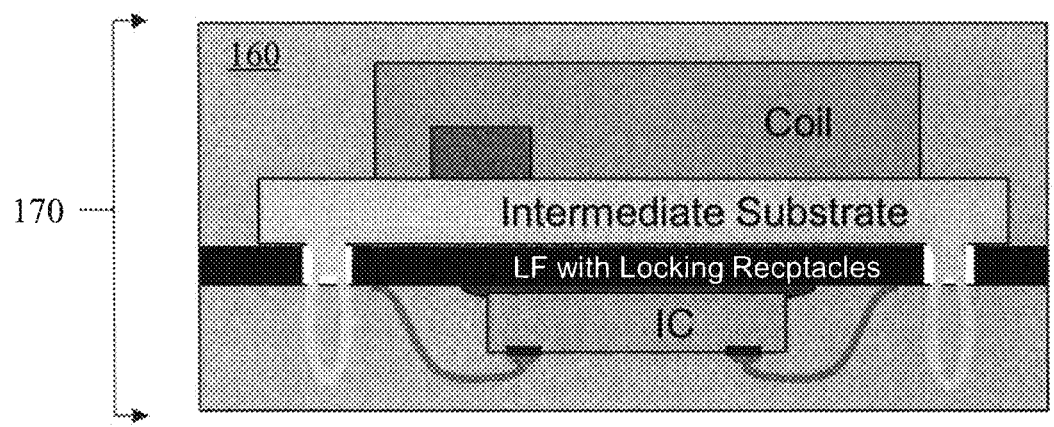

Refer to FIGS. 2A-2D. In an example embodiment, in an assembly 100, a coil and other passive components 105 are attached to an intermediate substrate 110. The intermediate substrate 105 has locking pins 115. On a top-side surface of a lead frame 120, the intermediate substrate 105 is inserted into the lead frame 120 having locking receptacles 125 to receive the locking pins 115 of the intermediate substrate 110. These locking pins 115 are formed so that when engaged into the locking receptacles 125, they may be frictionally held in. FIG. 2B depicts a structure 130 having the coil and other passive components 105 assembled on the intermediate structure 110, and lead frame 120. On an under-side surface of the lead frame 120, a device die 140 is die attached with a suitable die bonding material 135. The die bonding 135 may be with a glue, solder, ultrasonic welding, etc. Wire bonds 145 connect die attach pads 142 of the device die 140 with corresponding lead frame fingers so as to provide electrical connection to the device die 140. Predefined locations on the lead frame 120 provide electrical connections to and from passive components and the device die 140. Often, the locking pins 115 will be soldered to the predefined locations on the lead frame 120 to form electrical connections, as well. Having assembled all of the components, the assembly 150 of the device die 140, intermediate substrate 110, and passive components 105, is encapsulated into a molding compound 160. The completed device 170 of FIG. 2D undergoes additional process steps to prepare the device for the end-user.

Figure 3A:
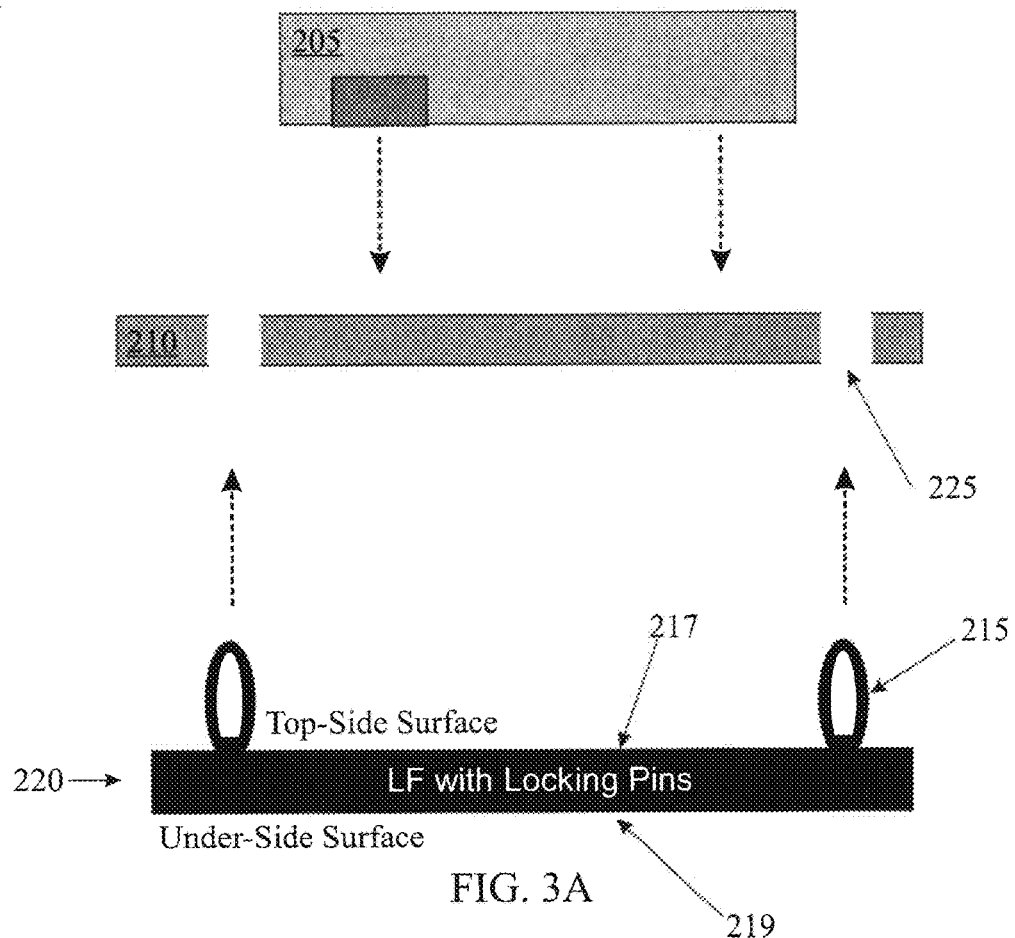
FIGS. 3A-3D present side view of assembly of an example embodiment of the present disclosure.
Figure 3B:
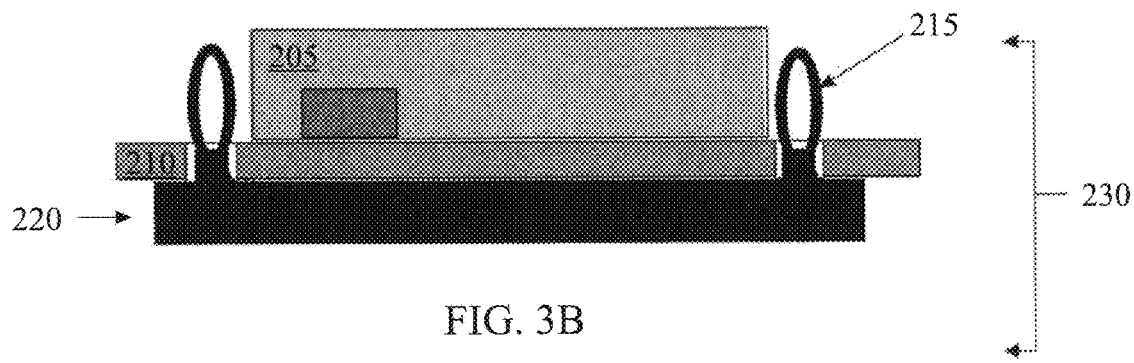
Figure 3C:
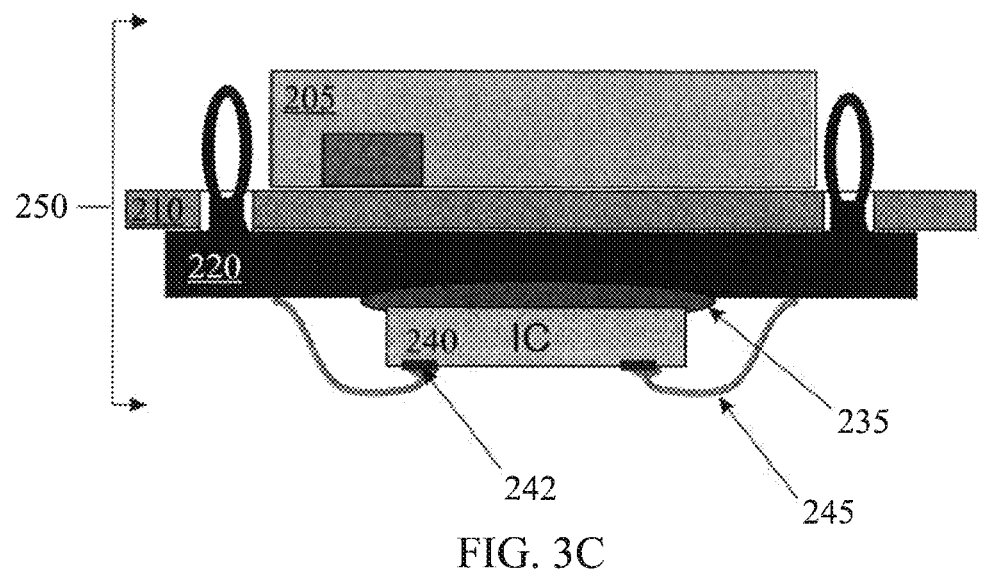
Figure 3D:
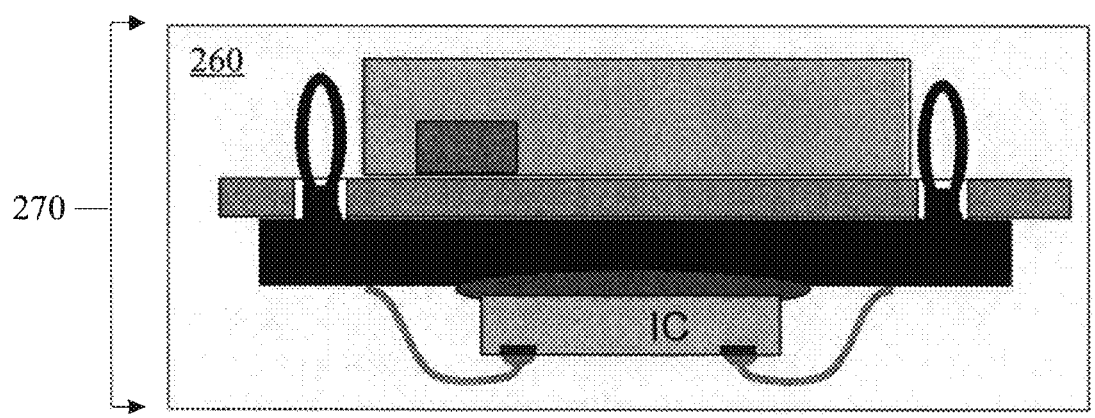

Refer to FIGS. 3A-3D. In another example embodiment, a coil and other passive components 205 are attached to an intermediate structure 210. Locking receptacles 225 are defined thereon. A lead frame 220 has locking pins 215 which engage with the locking receptacles 225 of the intermediate structure 210 as the intermediate structure 210 is mounted onto a side of the lead frame 220. In one embodiment, these locking pins 215 can be soldered to the locking receptacles 225 to enhance the electrical connection between the lead frame 220 and the passive components 205 mounted onto the intermediate structure 210. FIG. 3B shows the partially assembled device 230. Refer to FIG. 3C. On an opposite under-side surface of the lead frame 220, a device die 240 is die attached to the lead frame 220 with a suitable die bonding material 235. Wire bonds 245 connect die attach pads 242 of the device die 240 with corresponding lead frame fingers so as to provide electrical connection to the device die 240. The assembly 250 is encapsulated into a molding compound 260. The completed device 270 of FIG. 3D undergoes additional process steps to prepare the device for the end-user.

Figure 4A:
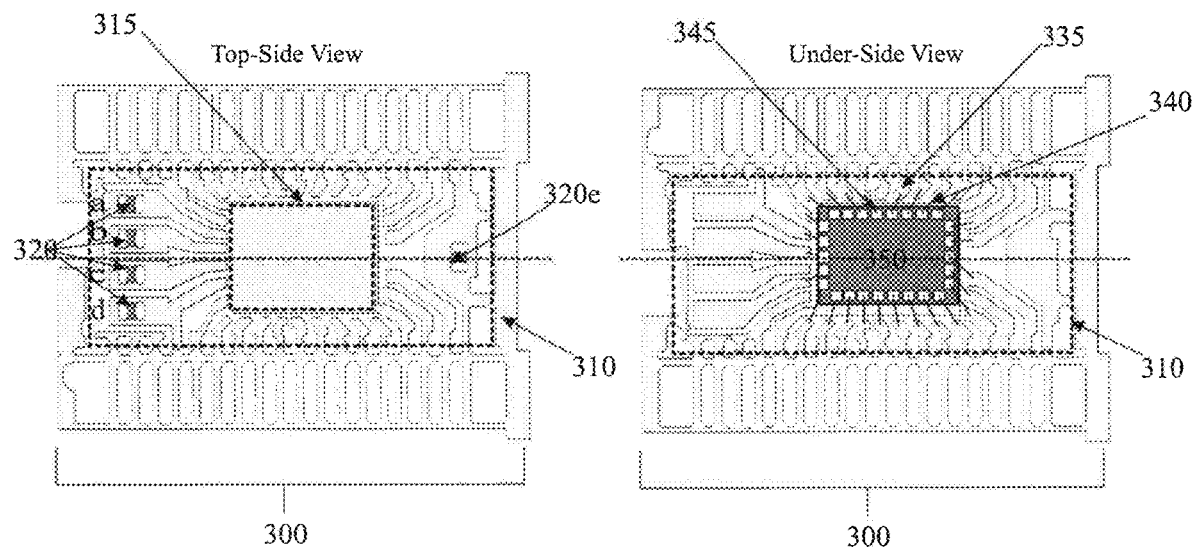
FIGS. 4A-4C present top-views of an embodiment of an automotive component assembled according to the present disclosure.
Figure 4B:
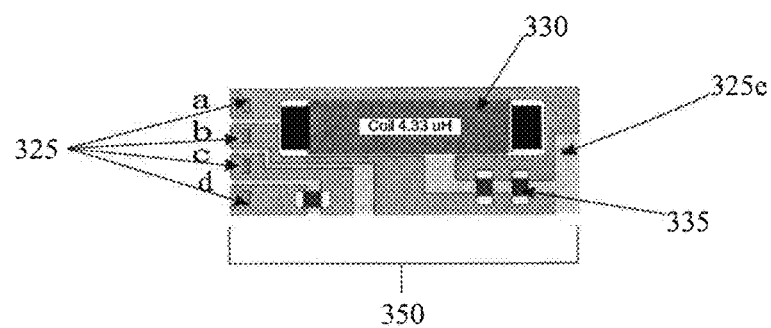
Figure 4C:
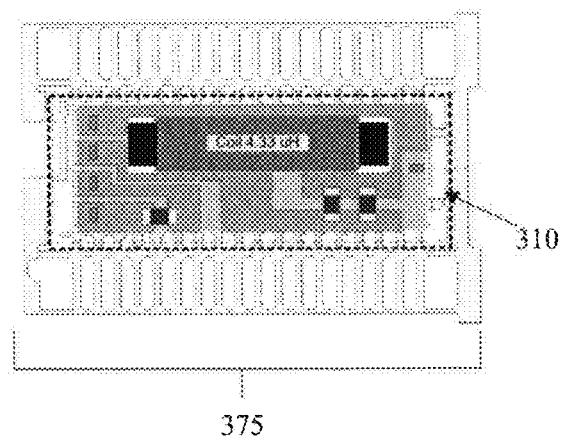

Refer to FIGS. 4A-4C. In an example embodiment, a lead frame 300 has a top-side surface and an opposite under-side surface. On a top-side surface of the lead frame 300, a dashed-line area 310 defines an area of the lead frame encompassing the completed active circuit/passive device module. On the opposite under-side surface of the lead frame 300, a die attach area 315 is defined by the dashed lines. Locking pins 320 have been defined in five locations (320a-e). In other embodiments, there may as few as one locking pin. To define a geometric plane and to enhance rigidity, three locking pins are distributed on the plane. On the opposite under-side surface of the lead frame 300, a device die 350 is bonded. Bond pads 345 are electrically connected to bond pad landings 335 via bond wires 340. The area defined by dashed lines 310 is where the lead frame is trimmed off after the device die and passive device module 350 are assembled. On the passive device module (intermediate structure) 350, corresponding holes (i.e., locking receptacles) 325 in five locations (325a-e) engage the locking pins 320. Passive devices which include a coil 330 and chip capacitors 335 are soldered onto the substrate of the intermediate structure 350. After engaging the locking pins 320 with the locking receptacles 325, the locking pins 320 may be secured mechanically by friction or gluing or soldering to these locking receptacle locations. The locations 325 may have metal through-hole plating and connect various passive components 330, 335 to particular device pads connected to the particular pad landings 335. Refer to 4C. The completed module 375 is encapsulated in a suitable molding compound. After encapsulation, the lead frame at the boundary 310 is trimmed.

Figure 5A:
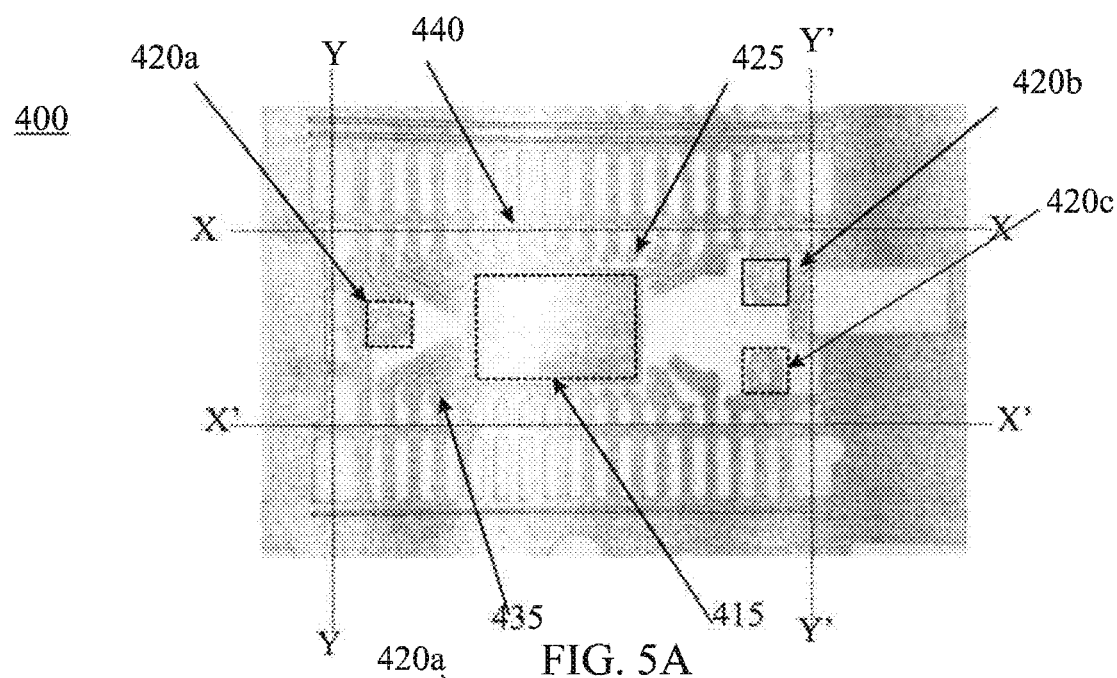
FIGS. 5A-5B illustrate a lead frame having locking clips and an intermediate substrate attached thereon according to the present disclosure.
Figure 5B:
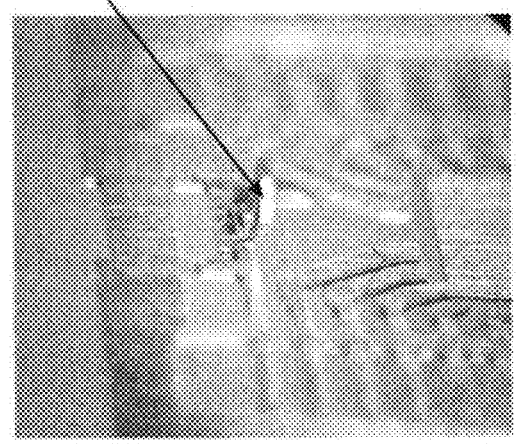

Refer to FIGS. 5A-5B. In an example embodiment, a lead frame 400 having three locking pins 420 (*a-c*) integrally formed, accepts an intermediate structure having corresponding locking receptacles. A die attach area 415 is on the underside surface of the lead frame 400. Pad landings 425 surround the die attach area. Dashed lines X, X' and Y, Y' define the area in which the lead frame 400 is trimmed after assembly of an electronic module according to the present disclosure. FIG. 5B shows a close-up view of the locking pin 420a on lead frame 400. Note that in FIG. 5B locking pins 420a-420c are bent upward and is perpendicular to the planar surface of the lead frame 400. The perpendicular locking pins 420a-420c engages the corresponding locking receptacle locations in an intermediate substrate attached thereon.

Figure 6:
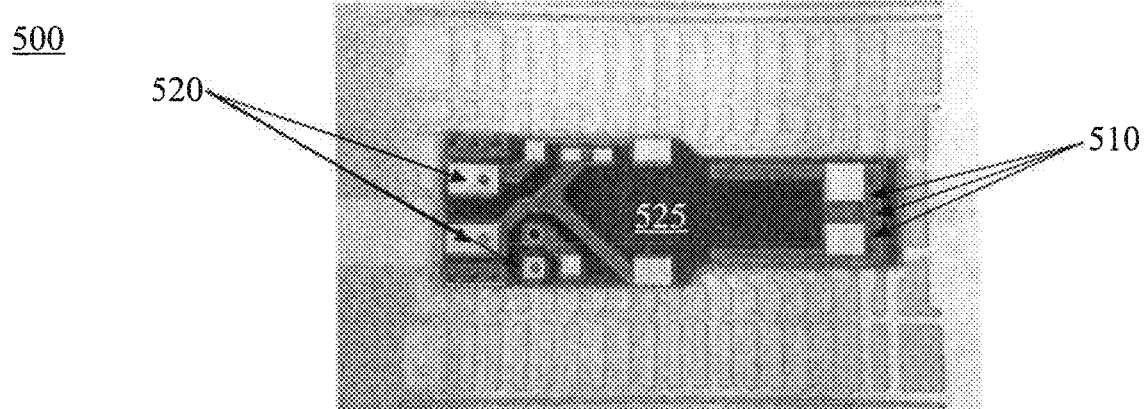
FIG. 6 illustrates a lead frame with an intermediate substrate attached via locking pins in accordance with the present disclosure.

Refer to FIG. 6. In an example embodiment, a lead frame 500 with an intermediate substrate 525 is attached to the lead frame 500 via locking pins 510 and 520.

Figure 7A:
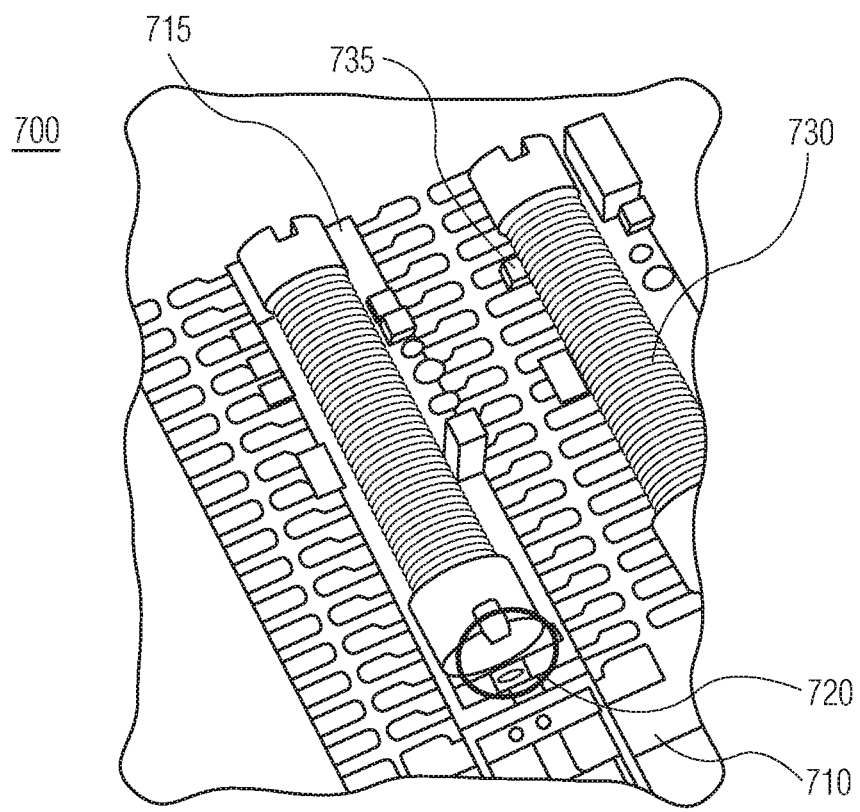
FIGS. 7A-7B illustrate a lead frame assembled with an intermediate substrate populated with passive components in accordance with the present disclosure.
Figure 7B:
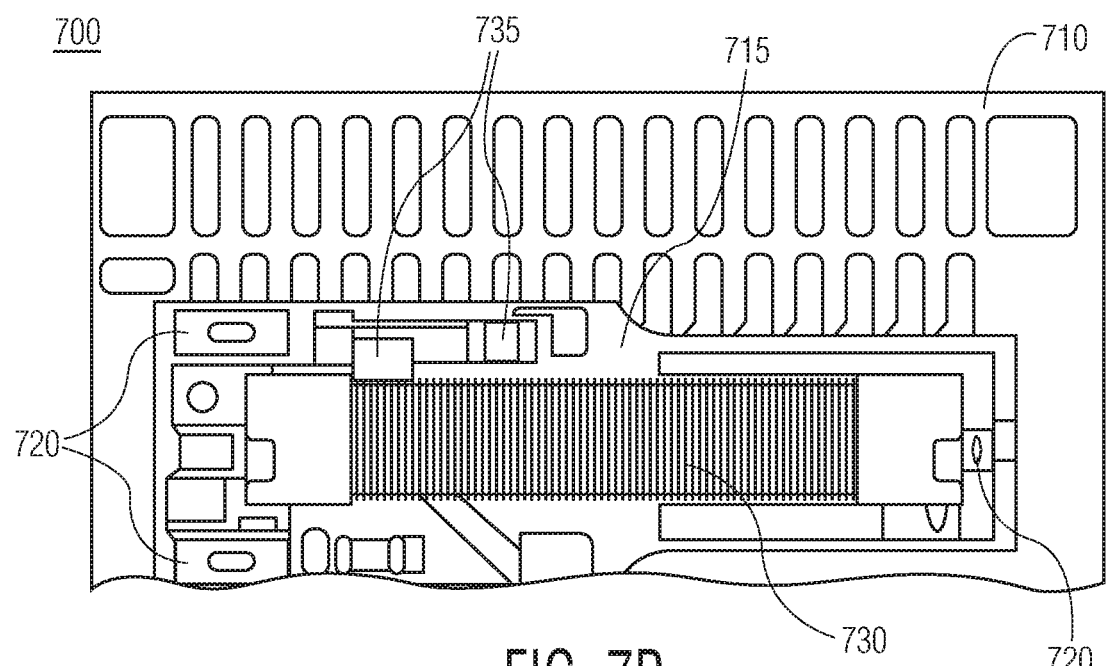

Refer to FIGS. 7A-7B. In an example embodiment, an assembly 700 has a lead frame 710 with locking pins 720 to which an intermediate substrate 715 is attached. Passive components 720 and a coil 730 are soldered onto the intermediate substrate 715. The locking pins 720 may frictionally engage with the intermediate substrate 715 in some applications or be engaged by soldering or a combination, thereof. In some other applications, the through holes in the intermediate substrate 715 may be plated to facilitate electrical connection or may only be a mechanical connection to hold the intermediate substrate 715 to the locking pins 720 of the lead frame 710. The mechanical connection may be such that the holes and locking pins are sized so that the locking pins frictionally engage with the holes.

Figure 8:
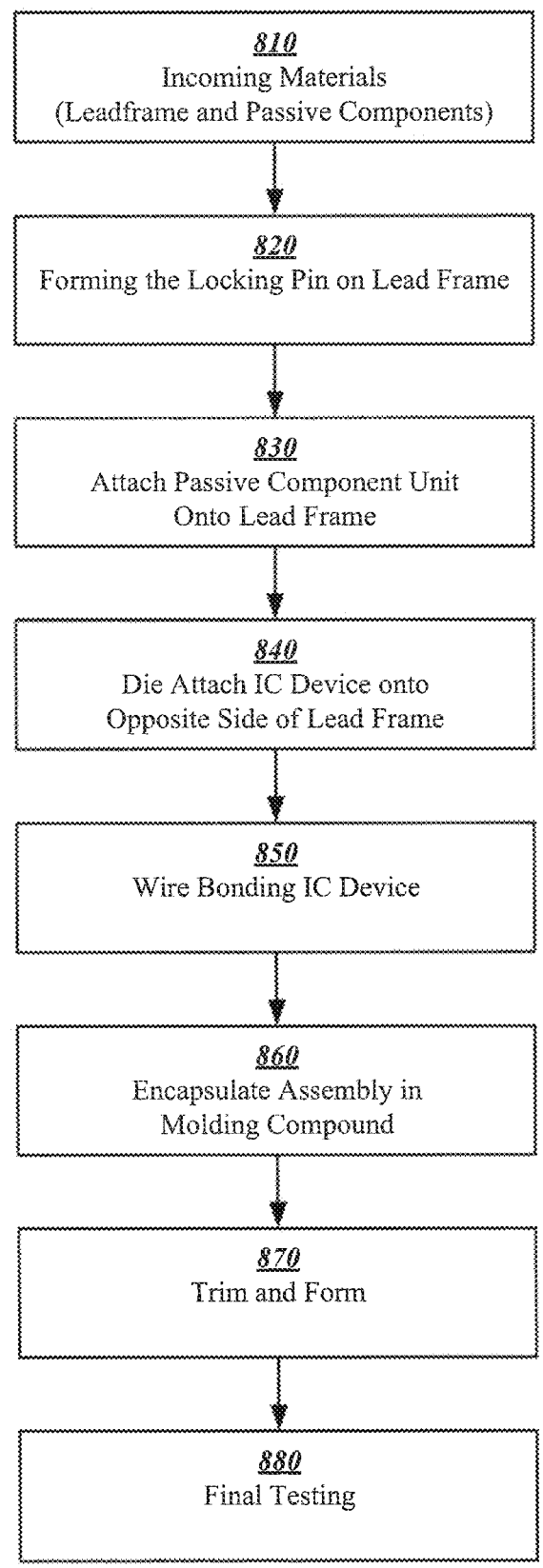
FIG. 8 is a flow diagram of the assembly of a device in accordance with the present disclosure.

Refer to FIG. 8. In step 810 an example process, the particular component has an assortment of incoming materials which may include the lead frame and passive components. The lead frame may have an array of device positions. In step 820, at predetermined locations, the locking pins are formed on the lead frame. Referring back to FIGS. 5A-5B, the integral locking pins 420a-420c, of lead frame 400, would be bent upward and perpendicular to the plane of the lead frame 400. Next in step 830, the passive component unit is attached onto a first side of the lead frame. In step 840, the IC device is attached to an opposite second side of the lead frame. At step 850, the IC device is wire bonded. Next in step 860, having made all of the electrical connections, the assembly is encapsulated in a molding compound. In step 870, the array of assembled units is trimmed and formed into individual devices. Then in step 880, the individual devices undergo a "final electrical" test 880 before shipping to the end user.

In accordance with the present disclosure, other molded package types may be used. The lead frame may be modified to accommodate an appropriately configured intermediate structure. Further, the embodiments of the present disclosure are applicable for all general System-in-Packages, as well as Package-in-Package. The related production tooling would be designed to facilitate assembly.

Various exemplary embodiments are described in reference to specific illustrative examples. The illustrative examples are selected to assist a person of ordinary skill in the art to form a clear understanding of, and to practice the various embodiments. However, the scope of systems, structures, and devices that may be constructed to have one or more of the embodiments, and the scope of methods that may be implemented according to one or more of the embodiments, are in no way confined to the specific illustrative examples that have been presented. On the contrary, as will be readily recognized by persons of ordinary skill in the relevant arts based on this description, many other configurations, arrangements, and methods according to the various embodiments may be implemented.

To the extent positional designations such as top, bottom, upper, lower have been used in describing this disclosure, it will be appreciated that those designations are given with reference to the corresponding drawings, and that if the orientation of the device changes during manufacturing or operation, other positional relationships may apply instead. As described above, those positional relationships are described for clarity, not limitation.

The present disclosure has been described with respect to particular embodiments and with reference to certain drawings, but the invention is not limited thereto, but rather, is set forth only by the claims. The drawings described are only schematic and are non-limiting. In the drawings, for illustrative purposes, the size of various elements may be exaggerated and not drawn to a particular scale. It is intended that this disclosure encompass inconsequential variations in the relevant tolerances and properties of components and modes of operation thereof. Imperfect practice of the invention is intended to be covered.

Where the term "comprising" is used in the present description and claims, it does not exclude other elements or steps. Where an indefinite or definite article is used when referring to a singular noun, e.g. "a" "an" or "the", this includes a plural of that noun unless something otherwise is specifically stated. Hence, the term "comprising" should not be interpreted as being restricted to the items listed thereafter; it does not exclude other elements or steps, and so the scope of the expression "a device comprising items A and B" should not be limited to devices consisting only of components A and B. This expression signifies that, with respect to the present disclosure, the only relevant components of the device are A and B.

Numerous other embodiments of the invention will be apparent to persons skilled in the art without departing from the spirit and scope of the invention as defined in the appended claims.

The invention claimed is:

1. A package assembly structure comprising:
   a lead frame having a top-side surface and an opposite under-side surface, the lead frame including:
   a die attach paddle, wherein a die attach region is defined on one of the top side surface and the opposite underside surface;
   pad landings surrounding the die attach region; and
   a plurality of gender-based locking mechanisms, including
   female locking mechanisms configured and arranged for receiving a plurality of locking pins, each locking pin having an expanded portion with a width that is greater than a width of a respective female locking mechanisms, arranged at predetermined locations about the die attach paddle, each of the female locking mechanisms having interior sidewalls defining an opening in an uncoupled state in which interior sidewalls are not engaged with the plurality of locking pins, the female locking mechanisms being configured and arranged to couple the lead frame to the plurality of locking pins by facilitating insertion of the plurality of locking pins therein and frictionally engaging with the expanded portion of a respective one of the plurality of locking pins by compressing the expanded portion of the locking pins as they are passed through the opening, and allowing the expanded portion to expand after passing through the opening in a coupled state in which the female locking mechanisms are coupled with the plurality of locking pins, the opening extending through the lead frame and both the top-side surface and the opposite under-side surface.

2. The package assembly structure, as recited in claim 1, further including an intermediate substrate including the plurality of locking pins formed integrally to the intermediate substrate and extending in length from the intermediate substrate, the plurality of pins being configured and arranged to lock the lead frame to the intermediate substrate by extending through and frictionally coupling to the interior sidewalls defining the openings of the female locking mechanisms.

3. The package assembly structure as recited in claim 1, wherein the interior sidewalls of the female locking mechanisms are plated to facilitate electrical conductivity and dimensioned to provide a friction fit to electrically couple to the plurality of locking pins.

4. The package assembly structure as recited in claim 1, wherein the plurality of gender-based locking mechanisms includes at least two of the locking pins.

5. The package assembly structure as recited in claim 4, wherein one or more locking pins electrically connects one or more corresponding pad landings via contact with the interior sidewalls defining the openings of the female locking mechanisms.

6. The package assembly structure of claim 1, wherein the plurality of gender-based locking mechanisms include the plurality of locking pins, each pin having a leading edge with a small diameter configured and arranged to facilitate entry of the pin through a locking mechanism receptacle, and a middle region having a large diameter configured and arranged to provide a friction force against the locking mechanism receptacle after the leading edge has passed through the locking mechanism receptacle.

7. The package assembly structure of claim 6, wherein each pin has an opening between opposing sides of curved exterior walls therein that define the small and large diameter.

8. The package assembly structure of claim 1, wherein the plurality of gender-based locking mechanisms are configured and arranged with the lead frame to lock an intermediate substrate to the lead frame, with an underside surface of the intermediate substrate in direct contact with the top-side surface.

9. The package assembly structure of claim 1, wherein the plurality of gender-based locking mechanisms include the locking pins, and the locking pins include:
a shaft portion having a length that extends from the top-side surface and passes through an intermediate substrate when an under-side surface of the intermediate substrate is in direct contact with the top-side surface, and
the expanded portion extending from the shaft portion, having a cross-section greater than the shaft portion and configured and arranged to, with the surface of the intermediate substrate being in direct contact with the top-side surface, expand upon passing through an opening in the intermediate substrate and, via the expansion, apply a pressure on a top-side surface of the intermediate substrate that holds the under-side surface of the intermediate substrate in direct contact with the top-side surface of the lead frame.

10. The package assembly structure of claim 1, wherein the expanded portion is configured and arranged to collapse for insertion through the opening in the female locking mechanisms, and to provide a force upon a back-side of the female locking mechanisms that secures the top-side surface of the lead frame directly to an under-side surface of an intermediate substrate.

11. The package assembly structure of claim 2, wherein the locking pins have a tapered leading edge having a diameter that is smaller than a diameter of a middle portion of the locking pins, and are configured and arranged to lock the lead frame to the substrate by extending the tapered leading edge through an opening in the substrate until the middle portion of the locking pins frictionally engages with an inner sidewall of the opening.

12. An electronic device comprising:
a lead frame having a top-side surface and an opposite under-side surface, the lead frame including, a die attach paddle, wherein a die attach region is defined on the opposite under-side surface, pad landings surrounding the die attach region; and a plurality of locking couplings of a first gender arranged at predetermined locations about the die attach paddle, on the top-side surface;
an intermediate substrate having a plurality of locking couplings of a second gender that are opposite the first gender corresponding to the predetermined locations for frictionally coupling with the locking couplings of the lead frame and providing mechanical connection between the lead frame and the intermediate substrate, the mechanical connection between one of the locking couplings of the first gender and a respective one of the locking couplings of the second gender, with the couplings of the opposite gender including a male locking coupling having an expanded portion, the female locking coupling having,
in an uncoupled state prior to engagement with the male locking coupling of the opposite gender, sidewalls that define an opening having a dimension that is less than a width of the expanded portion and therein provides a friction fit with the male locking coupling when inserted through the opening, and
in a coupled state in which the intermediate substrate is mounted on and secured directly to the top-side surface of the lead frame, a friction fit connection with the male locking coupling of the opposite gender with at least a portion of the expanded portion extending through the opening and having a width greater than the dimension of the opening, wherein the intermediate substrate has areas defined for passive component circuits; and
an active device die attached to the die attach region on the opposite under-side surface of the lead frame wherein bond pads of the active device die are electrically connected to the pad landings of the lead frame by conductive interconnects.

13. The electronic device as recited in claim 12,
wherein if the first gender is male, the locking coupling is a pin, and the second gender locking coupling is a hole; and
wherein if the first gender is female, the locking coupling is a hole, and the second gender locking coupling is a pin.

14. The electronic device as recited in claim 13, wherein on the lead frame, selected pad landings are electrically connected to the locking couplings at the predetermined locations, providing electrical connection from selected areas of the intermediate substrate to selected bond pads of the active device die, connecting passive components to the active device die.

15. The electronic device as recited in claim 14, wherein the intermediate substrate has passive components mounted thereon, the passive components being electrically connected to the locking couplings, the locking couplings being connected to the selected pad landings.

16. The electronic device of claim 12, wherein the plurality of locking couplings of one of the gender and the opposite gender include a pin having:
a leading edge with a small diameter configured and arranged to facilitate entry of the pin through one of the locking couplings of the other one of the gender and the opposite gender, and
a middle region having a thicker diameter configured and arranged to provide a friction force against the one of the locking couplings of the other one of the gender and the opposite gender after the leading edge has passed therethrough.

17. The electronic device of claim 12, wherein the intermediate substrate is secured directly to the top-side surface of the lead frame, with the top-side surface of the lead frame in contact with a surface of the intermediate substrate having the locking couplings.

18. An electronic device comprising:
a lead frame having first and second oppositely-facing side surfaces, the lead frame including, a die attach paddle, wherein a die attach region is defined on the first side surface, pad landings surrounding the die attach region, and a plurality of locking couplings of a first gender arranged at predetermined locations about the die attach paddle, extending from the second side surface; and
an intermediate substrate having a plurality of locking couplings of a second gender that are opposite the first gender corresponding to the predetermined locations for frictionally receiving the locking couplings of the lead frame and providing mechanical connection between the lead frame and the intermediate substrate, with one of the first gender and the second gender being a male gender and having a male locking coupling with an expanded portion, and the locking couplings of the opposite gender being a female gender and locking couplings of the female gender having,
in an uncoupled state prior to engagement with one of the male locking couplings of the opposite gender, sidewalls that define an opening having a dimension that is less than a width of the expanded portion and that provides a friction fit with the male locking coupling, the opening extending through the lead frame and both the first and second oppositely-facing side surfaces, and
in a coupled state a frictional connection to the male locking coupling with the intermediate substrate mounted on and secured directly to the second side surface of the lead frame, and with the expanded portion of the male locking coupling extending through the opening and expanded to a width that is greater than the dimension of the opening.

19. The electronic device of claim 18, wherein the plurality of locking couplings of one of the gender and the opposite gender include a pin having:
a leading edge with a small diameter configured and arranged to facilitate entry of the pin through one of the locking couplings of the other one of the gender and the opposite gender, and
a middle region having a thicker diameter configured and arranged to provide a friction force against the one of the locking couplings of the other one of the gender and the opposite gender after the leading edge has passed therethrough.

20. The electronic device of claim 18, wherein the intermediate substrate is secured directly to the second side surface of the lead frame, with the second side surface of the lead frame in contact with a surface of the intermediate substrate having the locking couplings.

* * * * *